United States Patent [19]

Takeuchi

[11] Patent Number: 5,332,923
[45] Date of Patent: Jul. 26, 1994

[54] SEMICONDUCTOR MEMORY

[75] Inventor: Kiyoshi Takeuchi, Tokyo, Japan

[73] Assignee: NEC Corporation, Tokyo, Japan

[21] Appl. No.: 925,167

[22] Filed: Aug. 6, 1992

[30] Foreign Application Priority Data

Aug. 6, 1991 [JP] Japan .................................. 3-196327

[51] Int. Cl.$^5$ ..................... H01L 27/02; H01L 23/48; H01L 29/68
[52] U.S. Cl. .................... 257/758; 257/296; 257/773; 257/907; 257/401
[58] Field of Search ............... 257/758, 296, 773, 905, 257/907, 908, 401

[56] References Cited

U.S. PATENT DOCUMENTS 4,583,111 4/1986 Early ..................... 257/775

Primary Examiner—Mark V. Prenty
Attorney, Agent, or Firm—Burns, Doane, Swecker & Mathis

[57] ABSTRACT

A semiconductor memory is provided which comprises memory cell regions disposed on a substrate, word lines which are connected respectively to the memory cells in the memory cell regions for controlling at least reading information from the memory cells, first bit lines which are formed in a first layer on the substrate and connected respectively to the memory cells for transmitting information, and second bit lines which are formed in a second layer and connected respectively to the memory cells for transmitting information, the second layer being formed on the substrate and electrically insulated from the first layer. The limitation of the layout upon the decrease of the bit line pitch can be eliminated, so that the reduction of the chip occupation area by shrinkage of areas between each adjacent memory cell regions can be realized. The first and second bit lines each is preferable to be patterned like stairs. The first and second bit lines are preferable to be disposed so as to go around the connecting area of the capacitor element for storing information and switching transistor in the memory cell.

14 Claims, 6 Drawing Sheets

SEMICONDUCTOR MEMORY

BACKGROUND OF THE INVENTION

Field of the Invention

This invention relates to a semiconductor memory.

Description of the Related Art

In general, a dynamic random access memory (DRAM) has memory cells each consisting of one capacitor element and one switching MOS transistor and storing one-bit data by corresponding amount of an electric charge stored in the capacitor element to the numerals "1" and "0", respectively. In reading out the data stored, normally, a potential difference between one bit line which is connected to a memory cell to be read out and another one bit line which is precharged to a reference voltage level is detected and amplified by a sense amplifier. In this case, the potential difference to be detected is very small and as a result, the influences of noise on the bit lines are required to be removed as much as possible. In order to meet such requirement, a so-called "folded bit line" structure has been adopted hitherto.

With the folded bit line structure, bit lines to be used for the memory cells and those to be used for reference are closely juxtaposed in pair on the same side of the sense amplifier thereby to make it possible to remove a substantial part of the external noise as a common mode. On the other hand, there exists another structure that bit lines to be used for the memory cells are disposed on one side of the sense amplifier and those to be used for reference are disposed on the opposite side thereof, which is a so-called "open bit line" structure.

With the open bit line structure, memory cells are disposed at all of the crossing points of bit lines and word lines. On the other hand, with the folded bit line one, memory cells are disposed at half of the crossing points of bit and word lines, so that there remains a large area between each adjacent memory cell regions. As a result, a problem of the chip occupation are becoming large as compared with the open bit line structure is raised.

This problem will be explained below while referring to the drawings attached. FIG. 1a exemplifies a layout of a conventional DRAM having the folded bit line structure and FIG. 1b exemplifies its equivalent circuit. With the layout shown above, a plurality of memory cell regions 1 which is substantially rectangular in shape are regularly disposed at intervals on a semiconductor substrate, each of which includes two switching MOS transistors Tr connected to each other and two capacitor elements C connected respectively to the transistors Tr. A memory cell comprises one transistor Tr and one capacitor element C and as a result, in this example, each of these memory cell regions 1 has two memory cells. The reference numeral 11 indicates a capacitor element region where the capacitor element C is provided. The capacitor element C is connected to the transistor Tr in the capacitor element region 11.

Word lines 2 and bit lines 3 are disposed perpendicularly to each other and the memory cell regions 1 are disposed perpendicularly to the word lines 2. The word lines 2 are connected at gate connecting areas 13 respectively to the gate electrodes of the transistors Tr, and the bit lines 3 are connected respectively to the source/drain connecting areas 12 to the transistors Tr.

Here, referring to each bit line 3, the memory cell regions 1 are formed only at a half of its crossing points with a plurality of word lines 2. The memory cell regions 1 belonging to each adjacent bit lines 3 are disposed at intervals as to make a mosaic pattern of arrangement as the whole, which means that as shown in FIG. 1, this DRAM remains a large area 5 between each adjacent memory cell regions 1 of one bit line 3.

As a method to solve this problem, there may be considered that the word lines and bit lines are crossed not perpendicularly but obliquely to each other, and that they are crossed perpendicularly to each other and the memory cells are disposed obliquely to the both lines, the layout diagrams of DRAMs of which are shown in FIGS. 2 and 3, respectively.

In FIG. 2, a plurality of rectangular memory cell regions 1a are disposed at intervals in the same direction and word lines 2a are disposed respectively perpendicularly to the memory cell regions 1a. On the other hand, the bit lines 3a are disposed obliquely respectively to the word lines 2a and memory cell regions 1a. The word lines 2a are connected at gate connecting areas 13a respectively to the gate electrodes of the transistors Tr of the memory cell regions 1a, and the bit lines 3a are connected respectively to the source/drain connecting areas 12a of the transistors Tr. The reference numeral 11a indicates a capacitor element region.

The bit lines 3a are slanted to the memory cell regions 1a, so that each adjacent memory cell regions 1a belonging to one bit line 3a are arranged in a stepped pattern in the direction where the word lines 2a are disposed. As a result, each adjacent memory cell regions 1a disposed perpendicularly to the word lines 2a are belonged to the different bit lines 3a, different from the case of FIG. 1a, so that there remains only a smaller area between the adjacent memory cell regions 1a than that of the layout in FIG. 1.

In FIG. 3, bit lines 3b and word lines 2b are disposed perpendicularly to each other. Memory cell regions 1b are parallelogrammic in shape and disposed at intervals in the direction where the corresponding sides of them are made parallel to each other. The memory cell regions 1b are slanted to both the bit lines 3b and word lines 2b. The word lines 2b are connected at gate connecting areas 13b respectively to the gate electrodes of the transistors Tr of the memory cell regions 1b, and the bit lines 3b are connected respectively to the source/drain connecting areas 12b of the transistors Tr. The reference numeral 11b indicates a capacitor element region.

The memory cell region 1b is slanted to both the word lines 2b and bit lines 3b and as a result, each adjacent memory cell regions 1b belong to the different bit lines 3b, different from the case of FIG. 1a, and corresponding adjacent memory cell regions 1b belonging to each adjacent bit lines 3b are disposed in a stair-like pattern in the direction opposite to the direction in which the memory cell regions 1b themselves are slanted to the word lines 2b. In this case, there remains only a smaller area between the adjacent memory cell regions 1b than that of the layout in FIG. 1.

As explained above, according the layout shown in FIG. 2 or 3, the area which remains between each adjacent memory cell regions can be made smaller than that of the case of FIG. 1a. In this case, however, a pitch of the bit lines becomes smaller than that of the case of FIG. 1a. As a result, even if intended to design a layout so as to minimize the chip occupation area by using the layout shown in FIG. 2 or 3, the arrangement of the memory cell regions is limited by the minimum pitch of the bit lines allowable on design rules, which means that there remains a problem that reduction of the chip occupation area cannot be practically realized.

Besides, in a high density DRAM, for example 64M bits or more, having stacked capacitors, the capacitor elements C are usually formed above the bit lines, so that the bit lines are required to be disposed so as not to pass just over the connecting areas of the transistors Tr and the capacitor elements C. From this point of view, the layout shown in FIG. 2 or 3 becomes small in pitch of the bit lines, that is, the density of the bit lines becomes large as explained above, which means that there remains a problem that the requirement is difficult to satisfy.

Thus, an object of this invention is to provide a semiconductor memory in which reduction of the chip occupation area thereof by shrinkage of areas between each adjacent memory cell regions can be realized without suffering from decrease in bit line pitch.

Another object of this invention is to provide a semiconductor memory in which bit lines can be disposed so as not to pass just over the connecting areas of transistors and capacitor elements.

SUMMARY OF THE INVENTION

A semiconductor memory of this invention comprises a plurality of memory cell regions disposed on a substrate a plurality of word lines which are connected respectively to the memory cells in these memory cell regions for controlling at least reading information from these memory cells, a plurality of first bit lines which are formed in a first layer on the substrate and connected respectively to the memory cells for transmitting information, and a plurality of second bit lines which are formed in a second layer and connected respectively to the memory cells for transmitting information, the second layer being formed on the substrate and electrically insulated from the first layer.

According to the semiconductor memory of this invention, when the folded bit line structure is adopted, bit lines which are connected respectively to memory cells can be formed in the first layer, and bit lines which are used for reference and disposed adjacently to the memory cell bit lines respectively can be formed in the second layer electrically insulated from the first layer. As a result, the limitation of the layout upon the decrease of the bit line pitch as described above referring to FIGS. 2 or 3 can be eliminated, so that the reduction of the chip occupation area by shrinkage of areas between each adjacent memory cell regions can be realized without suffering from decrease in bit line pitch.

The shape of each of the first and second bit lines is not specifically limited, but preferable to be made bent like stairs. In this case, the first and second bit lines each is preferable to have first sections extended along the memory cell regions and second sections crossing with the memory cell regions, and further preferable to be connected at the second sections to the memory cells. In addition, the angle that the first section makes with the second section can be set appropriately in accordance with the arrangement pattern of the memory cell regions, but it is preferable to be about 90 degrees or to be obtuse.

The first and second bit lines are preferable to be displaced in position so that the area where they are overlapped each other can be minimized. For example, when the first bit line is passed over one of adjacent memory cell regions, the second bit line is passed over the other of the adjacent memory cells. In this case, when the second sections of the first and second bit lines are respectively disposed by taking an angle (for example, of about 45 degrees) with the memory cell regions, the area where the first and second bit lines are overlapped each other can be advantageously made smaller.

The arrangement of the word lines is not limited specifically and as a result, may be made perpendicular or oblique to the first and/or second bit lines.

The arrangement of the memory cell regions is not limited specifically, any arrangement can be used, if the area between each adjacent memory cell regions can be made small. That is, it may be made perpendicular to the word lines as shown in FIG. 2 or oblique thereto as shown in FIG. 3. The arrangement of the memory cell regions may be made perpendicular or oblique to the first and/or second bit lines and/or the word lines. The memory cell region is not specifically limited on its shape and as a result, may be substantially rectangular or parallelogrammic.

The memory cell is not specifically limited on its structure, but preferable to include a capacitor element for storing information and a switching transistor. In this case, the first and second bit lines are preferable to be disposed so as to go around respective connecting areas of the capacitor elements and switching transistors, that is, so as not to pass just over the connecting areas thereof, which is advantageous in that the production method can be made easy.

BRIEF DESCRIPTION OF THE DRAWINGS

FIG. 1b is a diagram showing an equivalent circuit of the semiconductor memory shown in FIG. 1a.

FIG. 2 is a layout diagram showing an example of a semiconductor memory in order to solve the problems arisen in the conventional one shown in FIG. 1a.

FIG. 3 is a layout diagram showing another example of a semiconductor memory in order to solve the problems arisen in the conventional one shown in FIG. 1a.

DESCRIPTION OF THE PREFERRED EMBODIMENTS

Some embodiments of this invention will be described below while referring to FIGS. 4 to 6.

First Embodiment

Figure 1A:
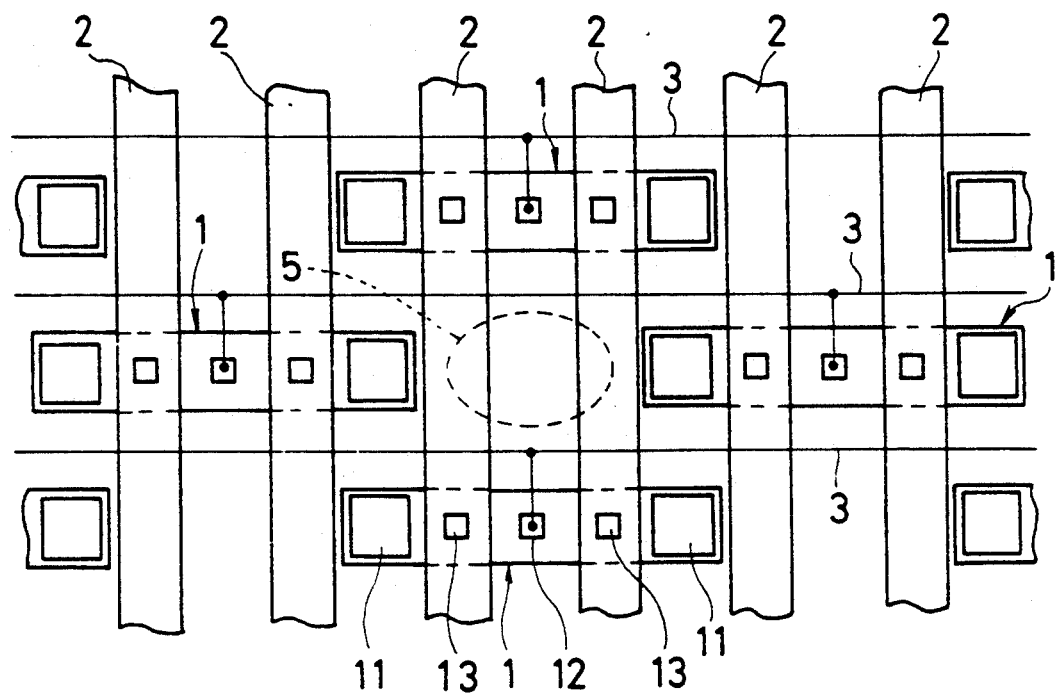
FIG. 1a is an example of a layout diagram of a conventional semiconductor memory.
Figure 1B:
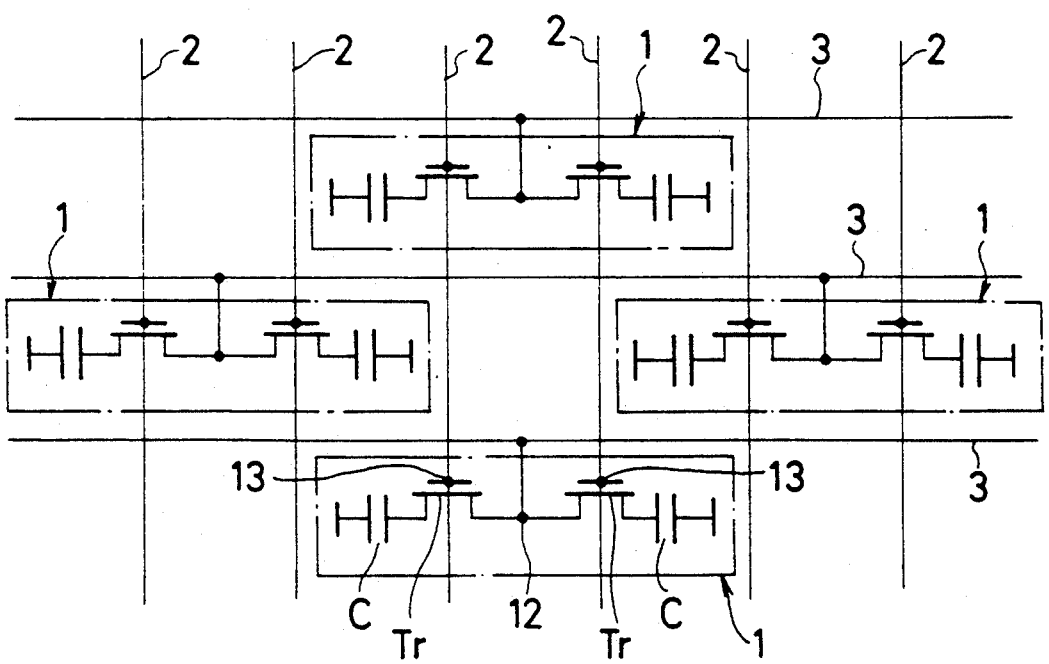
Figure 2:
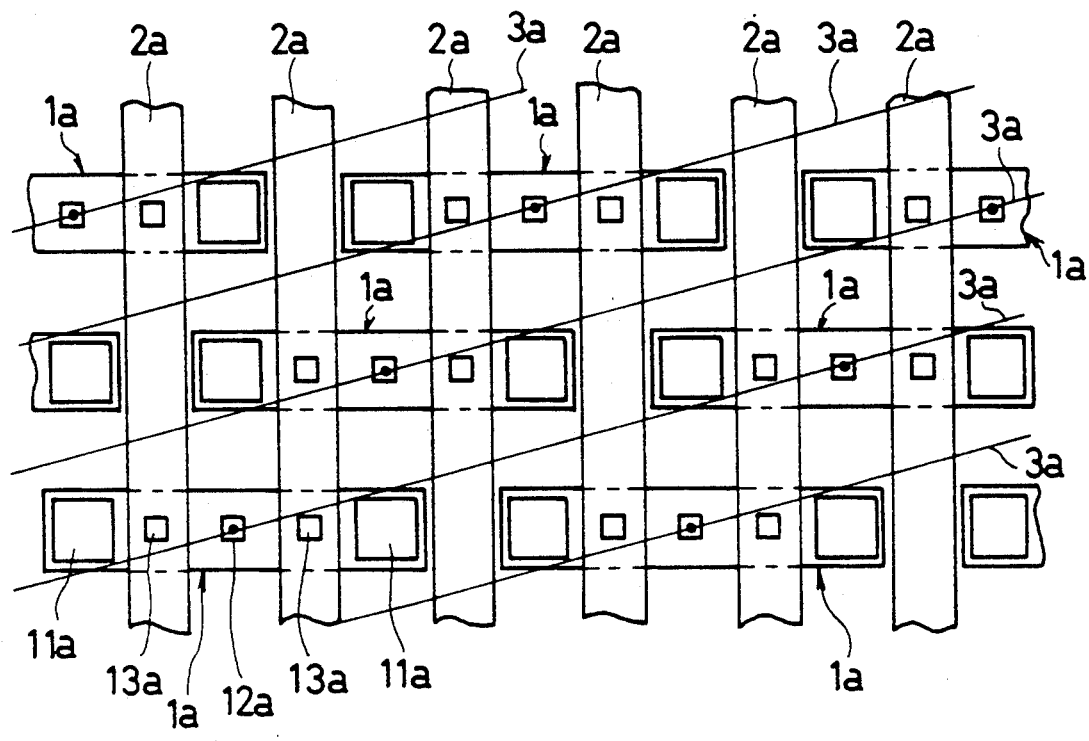
Figure 4:
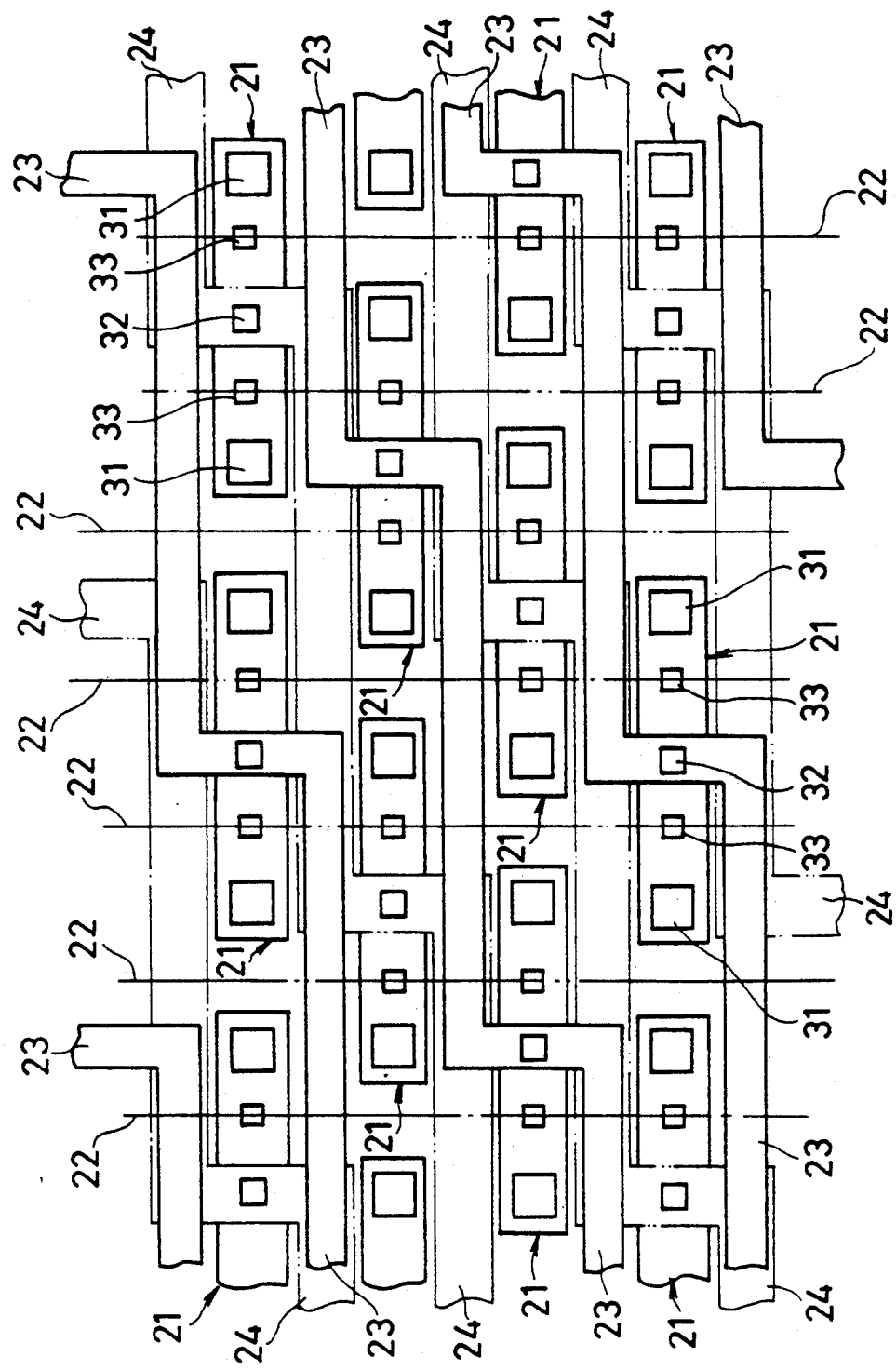
FIG. 4 is a layout diagram of a semiconductor memory according to a first embodiment of this invention.

FIG. 4 shows a layout of DRAM according to a first embodiment of this invention, which is of the folded bit line structure. In FIG. 4, a plurality of memory cell regions 21 are disposed in the same pattern as that shown in FIG. 2. That is, the rectangular memory cell regions 21 are regularly disposed at intervals on a semiconductor substrate. In each region 21, though not shown, two switching MOS transistors and two capacitor elements are formed as shown in FIG. 1a. As a result, the layout in this embodiment has memory cell regions 21 each having two memory cells. Word lines 22 are respectively disposed perpendicularly to the memory cell regions 21.

With one memory cell region 21 as the reference, the other memory cell regions 21 are juxtaposed at equal intervals in the longitudinal direction of the reference cell region 21 (the direction perpendicular to the word line 22) and on the other hand, they are juxtaposed at equal intervals in the transversal direction thereof (the direction parallel to the word line 22) with a displacement in position from each other in the longitudinal direction thereof. Namely, the memory cell regions 21 are disposed in a pattern like stairs so that the displacement becomes large gradually as being remote from the reference region 21. In this case, an area between each adjacent memory cell regions 21 becomes small as compared with the case of FIG. 1a.

In FIG. 4, first bit lines 23 shown by the continuous line are formed in a first bit line layer, and second bit lines 24 shown by the alternate long and short dash line are formed in a second bit line layer which is electrically insulated from the first bit line layer. In this embodiment, a word line layer in which the word lines 22 are formed, the second bit line layer and the first bit line layer are laminated in this order on the semiconductor substrate.

The first bit lines 23 each is bent like stairs in shape, that is, as shown in FIG. 4, it has sections extended along the memory cells 21 and sections perpendicular thereto at which the first bit lines 23 each is connected to source/drain connecting areas 32 of the memory cell regions 21. The extended sections along the memory cell regions 21 are respectively placed between adjacent memory cell regions 21.

The second bit lines 24 formed beneath the first bit lines 23 each has the same shape as that of the first bit line 23 and is connected at the sections perpendicular to the region 21 to the corresponding source/drain connecting areas 32 thereof. The extended sections along the regions 21 are also respectively place between adjacent memory cell regions 21.

The first bit line 23 and second bit line 24 are disposed with a positional displacement from each other so that the area where those bit lines 23 and 24 are overlapped can be minimized. Namely, they are disposed such that if the first bit line 23 is passed over one of adjacent memory cell regions 21, the second bit line 21 is passed over the other of the adjacent memory cell regions 21. As a result, the first and second bit lines 23 and 24 are overlapped each other only in the length range of about a half of the region 21 in the area between adjacent regions 21.

The word lines 22 are connected at gate connecting areas 33 respectively to the gate electrodes of the transistors of the memory cell regions 21. The capacitor element regions 31 in the memory cell region 21 each has a capacitor element which is connected to the transistor in the same memory cell region 21.

In this embodiment, both the pitch of the first bit lines 23 formed in the first bit line layer and the pitch of the second bit lines 24 formed in the second bit line layer will be doubled compared with the case of forming the both bit lines 23 and 24 in one layer. As a result, there is no influence of the bit line pitch to the reduction of chip occupation area. Accordingly, if one of adjacent first bit line 23 and second bit line 24 is connected to the memory cell and the other thereof is used for reference, reduction of the chip occupation area can be practically realized by shrinkage of the areas between each adjacent memory cell regions 21.

Also, in this embodiment, there is sufficient margin in the pitches of the first and second bit lines 23 and 24 as shown above, so that the bit lines 23 and 24 can be disposed by going around or bypass the capacitor element region 31 which includes the connecting area of the capacitor element and transistor, as shown in FIG. 4. This means that the production method thereof can be made easier.

Second Embodiment

Figure 5:
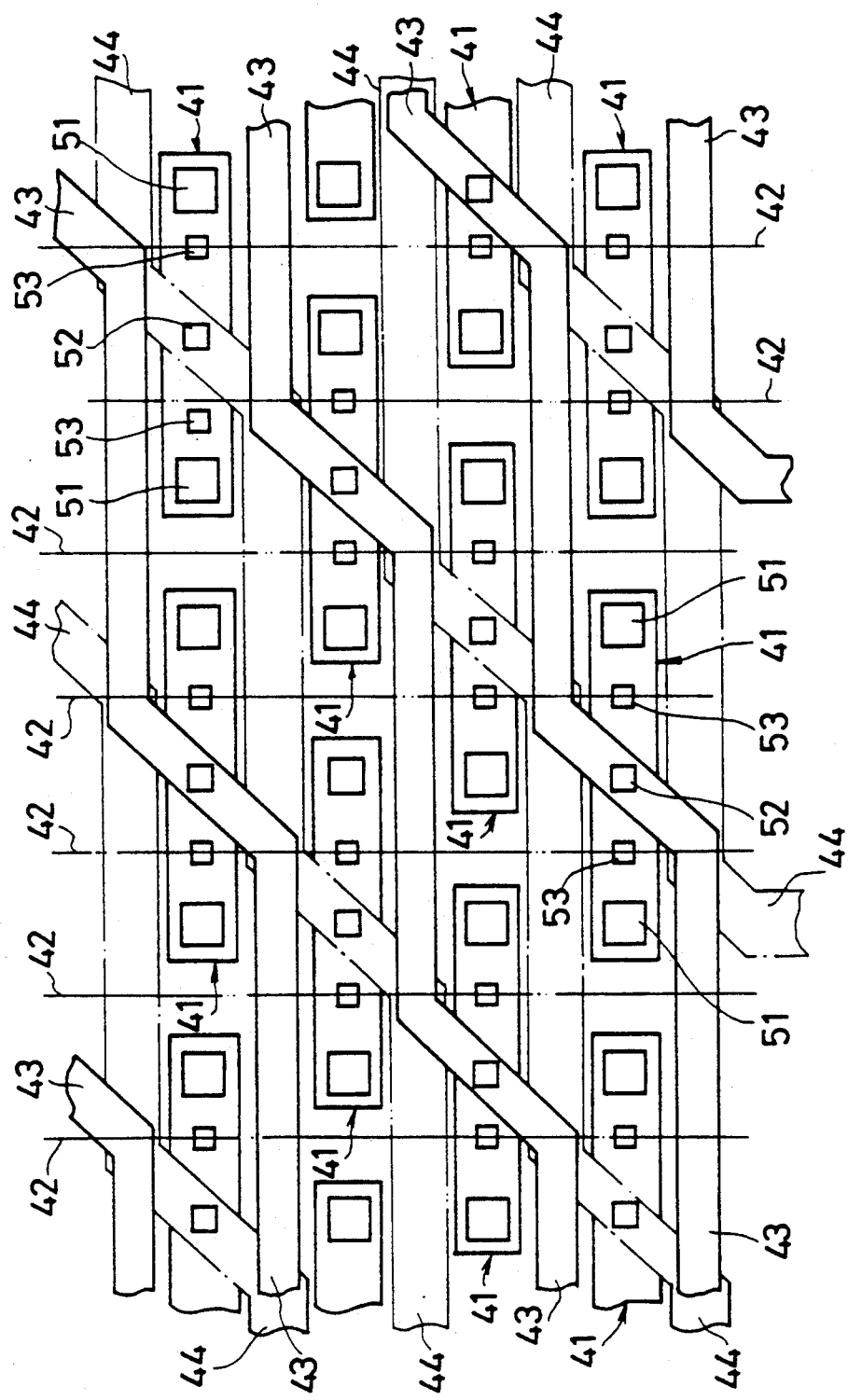
FIG. 5 is a layout diagram of a semiconductor memory according to a second embodiment of this invention.

FIG. 5 shows a layout of DRAM according to a second embodiment of this invention, which is different from that shown in the first embodiment only in that the first and second bit lines have their sections slanted to the memory cell regions.

In FIG. 5, memory cell regions 41 are equal in shape and arrangement to the memory cell regions 31 in the first embodiment, and word lines 42, first bit lines 43 and second bit lines 44 are also equal in arrangement to those in the first embodiment. Similar to the first embodiment, in FIG. 5, the memory cell region 41 has a capacitor element region 51, a source/drain connecting area 52 and a gate connecting area 53. A memory cell in the respective regions 31 has two capacitor elements for storing information and two switching MOS transistors. The word lines 42 are connected at the gate connecting areas 53 respectively to the gate electrodes of the transistors, and the first and second bit lines 43 and 44 are connected respectively to the source/drain connecting areas 52.

In this embodiment, the first and second bit lines 43 and 44 have their sections slanted by about 45 degrees to the memory cell regions 41, so that the area where the first and second bit lines 43 and 44 are overlapped becomes advantageously smaller than that in the first embodiment.

As in the first embodiment, the first and second bit lines 43 and 44 are also disposed so as to go around the capacitor element region 51 including the connecting area of the capacitor element and transistor.

Third Embodiment

Figure 3:
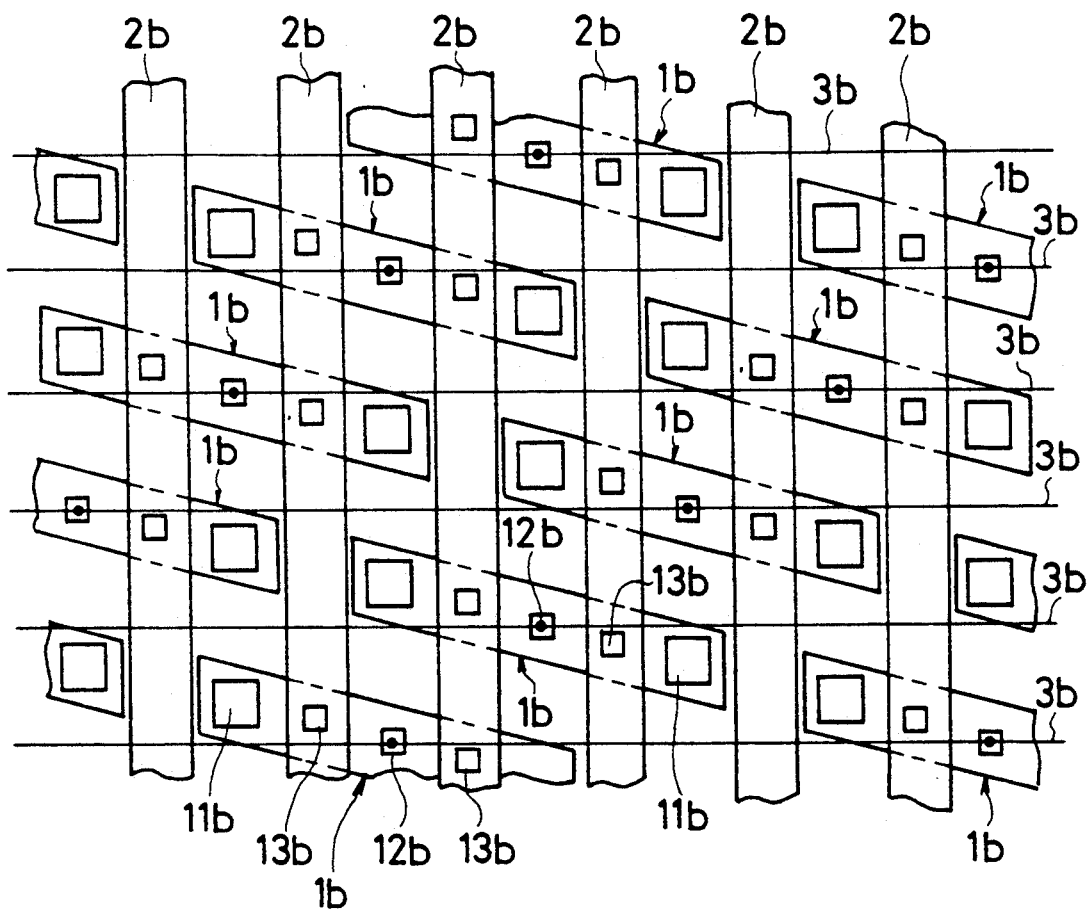
Figure 6:
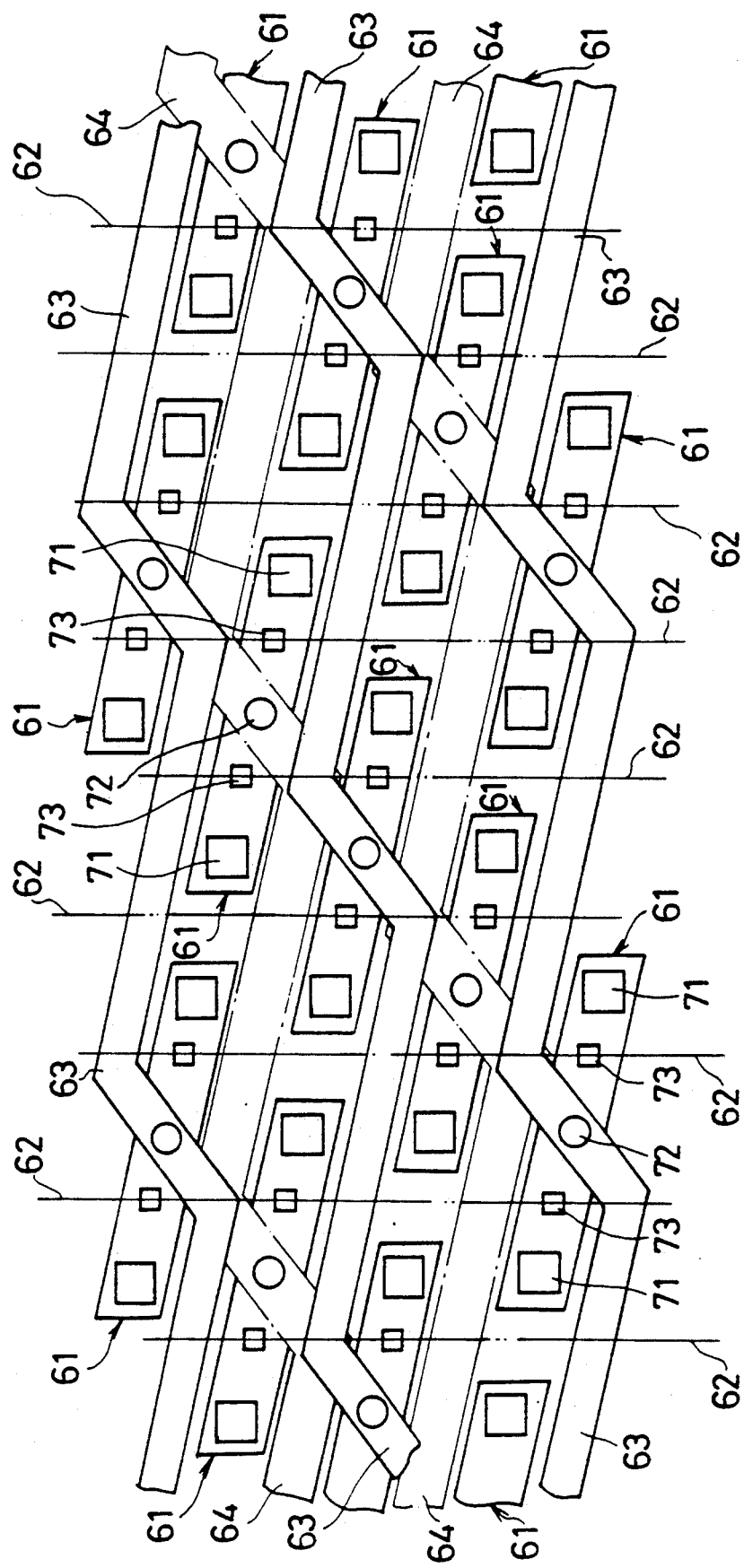
FIG. 6 is a layout diagram of a semiconductor memory according to a third embodiment of this invention.

FIG. 6 is a layout diagram of DRAM according to a third embodiment of this invention. This layout is equal in arrangements of memory cell regions and word lines to those shown in FIG. 3 and equal in arrangements of first and second bit lines to those shown in FIG. 5.

In FIG. 6, a plurality of parallelogram-shaped memory cell regions 61 are disposed obliquely to the word lines 62. In this case, with one memory cell region 61 as the reference, the other memory cell regions 61 are juxtaposed at equal intervals in the longitudinal direction of the reference memory cell region 61, and on the other hand, they are also juxtaposed at equal intervals in the transversal direction thereof with a displacement in position from each other in the longitudinal direction thereof. This means that the memory cell regions 61 are disposed in a stair-like pattern so that the displacement becomes large gradually as being remote from the reference memory cell region 61. As a result, an area unused between each adjacent memory cell regions 61 becomes small as compared with the case of FIG. 1a.

The first bit line 63 and second bit line 64 each has sections disposed between adjacent memory cell regions 61 and extended along the memory cell regions 61 and sections slanted to the extended sections and crossing with the memory cell regions 61. The extended and slanted sections both are oblique to the word lines 62.

The first and second bit lines 63 and 64 are disposed in the same positional relationship as shown in the first embodiment. That is, if the first bit line 63 is passed over one of adjacent memory cell regions 61, the second bit line 64 is passed over the other of the adjacent memory cell regions 61. The first and second bit lines 63 and 64 are overlapped each other only in a small range of area between the adjacent memory cell regions 61.

Similar to the first and second embodiments, the memory cell region 61 has capacitor element regions 71, a source/drain connecting area 72 and gate connecting areas 73. The memory cell thereof has two capacitor elements for storing information and two switching MOS transistors. The word lines 62 are connected at the gate connecting areas 73 respectively to the gate electrodes of the transistors, and the first and second bit lines 63 and 64 are connected respectively to the source/drain connecting areas 72 thereof.

As explained here, in this invention, the memory cell regions may be slanted to the word lines.

Even in this third embodiment, the first and second bit lines 63 and 64 are disposed so as to go around the capacitor element region 71.

As described above, the DRAMs according to the above embodiments makes it possible to realize reduction of the chip occupation area as well as effective to dispose a bit line so as not to pass just over the connecting areas of the transistors and the capacitor elements.

What is claimed is:

1. A semiconductor memory having a folded bit-line structure, comprising:
   a plurality of memory cell regions disposed on a semiconductor substrate;
   a plurality of word lines which are connected respectively to memory cells in said memory cell regions, said word lines being arranged along a first direction at given intervals;
   a plurality of first bit lines which are formed in a first layer over said substrate and connected respectively to said memory cells, said first bit lines being arranged along a second direction at given intervals,
   said second direction being substantially perpendicular to said first direction; and
   a plurality of second bit lines which are formed in a second layer over said first layer and connected respectively to said memory cells,
   said second bit lines being arranged substantially along said second direction at given intervals, and
   said second layer being electrically insulated from said first layer.

2. A semiconductor memory comprising:
   a plurality of memory cell regions disposed on a semiconductor substrate;
   a plurality of word lines which are connected respectively to memory cells in said memory cell regions;
   a plurality of first bit lines which are formed in a first layer over said substrate and connected respectively to said memory cells; and
   a plurality of second bit lines which are formed in a second layer over said first layer and connected respectively to said memory cells,
   said second layer being electrically insulated from said first layer,
   wherein said first and second bit lines are bent in shape in a stair-like pattern.

3. A semiconductor memory as claimed in claim 2, wherein said first and second bit lines each has first sections extended along said memory cell regions and second sections joined to said first sections and crossing said memory cell regions.

4. A semiconductor memory as claimed in claim 3, wherein said first and second sections make an angle of about 90 degrees with respect to each other.

5. A semiconductor memory as claimed in claim 3, wherein said first and second sections make an obtuse angle with respect to each other.

6. A semiconductor memory as claimed in claim 3, wherein said second section obliquely cross said memory cell regions.

7. A semiconductor memory comprising:
   a plurality of memory cell regions disposed on a semiconductor substrate;
   a plurality of word lines which are connected respectively to memory cells in said memory cell regions;
   a plurality of first bit lines which are formed in a first layer over said substrate and connected respectively to said memory cells; and
   a plurality of second bit lines which are formed in a second layer over said first layer and connected respectively to said memory cells,
   said second layer being electrically insulated from said first layer,
   wherein said first and second bit lines are disposed with a positional displacement relative to each other so as to minimize an area where said first and second bit lines are overlapped.

8. A semiconductor memory as claimed in claim 7, wherein said first bit line passes over one of two adjacent memory cell regions and said second bit line passes over the other of the adjacent two memory cell regions.

9. A semiconductor memory as claimed in claim 1, wherein said memory cells are each substantially rectangular in shape.

10. A semiconductor memory as claimed in claim 1, wherein said memory cells are each substantially parallelogrammic in shape.

11. A semiconductor memory as claimed in claim 10, wherein said memory cells are disposed obliquely to said word lines.

12. A semiconductor memory as claimed in claim 1, wherein said memory cells each comprise at least a capacitor element for storing information and a switching transistor.

13. A semiconductor memory as claimed in claim 12, wherein said first and second bit lines are disposed so as to go around a connecting area of said capacitor element and switching transistor.

14. A semiconductor memory as claimed in claim 1, wherein said first and second bit lines are disposed so as to go around a connecting area of a capacitor element and a switching transistor of said memory cells.

* * * * *